(12) United States Patent
Gill et al.

(10) Patent No.: US 10,854,652 B2
(45) Date of Patent: Dec. 1, 2020

(54) OPTICAL SENSING WITH TESSELLATED DIFFRACTION-PATTERN GENERATORS

(71) Applicant: Rambus Inc., Sunnyvale, CA (US)

(72) Inventors: Patrick R. Gill, Sunnyvale, CA (US); David G. Stork, Portola Valley, CA (US)

(73) Assignee: Rambus Inc., San Jose, CA (US)

( * ) Notice: Subject to any disclaimer, the term of this patent is extended or adjusted under 35 U.S.C. 154(b) by 151 days.

(21) Appl. No.: 15/861,373

(22) Filed: Jan. 3, 2018

(65) Prior Publication Data

US 2018/0197909 A1 Jul. 12, 2018

Related U.S. Application Data

(63) Continuation of application No. 15/356,363, filed on Nov. 18, 2016, now Pat. No. 9,876,043, which is a (Continued)

(51) Int. Cl.
*G02B 27/44* (2006.01)
*G02B 27/46* (2006.01)
(Continued)

(52) U.S. Cl.
CPC ...... *H01L 27/14625* (2013.01); *G02B 5/1819* (2013.01); *G02B 5/1842* (2013.01); (Continued)

(58) Field of Classification Search
CPC ......... H01L 27/14605; H01L 27/14806; H01L 27/14621; H01L 27/14625; H01L 27/14627; H01L 27/14623; H01L 27/14629; H01L 27/14685; H01L 27/1462; H01L 27/1464; H04N 2201/04746; H04N 2201/04748; H04N 2201/04749; H04N 2201/04751; G02B 5/00; G02B 5/008;
(Continued)

(56) References Cited

U.S. PATENT DOCUMENTS 6,137,535 A * 10/2000 Meyers ................ G02B 3/0043
348/340
7,202,896 B2 4/2007 Wako et al.
(Continued)

OTHER PUBLICATIONS

Garcia-Martinez et al., "Generation of Bessel Beam Arrays Through Dammann Gratings", Mar. 20, 2012, vol. 51, No. 9, Applied Optics. pp. 1375-1381. 7 Pages.
(Continued)

*Primary Examiner* — Mustak Choudhury
(74) *Attorney, Agent, or Firm* — Silicon Edge Law Group LLP; Arthur J. Behiel

(57) ABSTRACT

An array of diffraction-pattern generators employ phase anti-symmetric gratings to projects near-field spatial modulations onto a closely spaced array of photoelements. Each generator in the array of generators produces point-spread functions with spatial frequencies and orientations of interest. The generators are arranged in an irregular mosaic with little or no short-range repetition. Diverse generators are shaped and placed with some irregularity to reduce or eliminate spatially periodic replication of ambiguities to facilitate imaging of nearby scenes.

20 Claims, 15 Drawing Sheets

Related U.S. Application Data continuation of application No. 14/462,644, filed on Aug. 19, 2014, now Pat. No. 9,515,113.

(60) Provisional application No. 61/870,468, filed on Aug. 27, 2013.

(51) Int. Cl.
*H01L 27/146* (2006.01)
*G02B 5/18* (2006.01)

(52) U.S. Cl.
CPC .... *H01L 27/1462* (2013.01); *H01L 27/14623* (2013.01); *H01L 27/14627* (2013.01); *H01L 27/14629* (2013.01)

(58) Field of Classification Search
CPC ...... G02B 5/04; G02B 5/0215; G02B 5/0221; G02B 5/0252; G02B 5/0268; G02B 5/18; G02B 5/203; G02B 5/1814; G02B 5/1842; G02B 5/1819; G02B 5/1861; G02B 5/1866; G02B 5/1871; G02B 3/0043; G02B 3/0056; G02B 3/0068; G02B 3/04; G02B 3/08; B23K 15/0006; B23K 15/02; G01B 11/2509; G01B 11/2513; G01B 11/2518; G01J 3/2846
USPC ....... 359/558–576, 618, 640, 361, 599, 707, 359/837; 348/43, 277–282, 302, 315, 348/340, 291; 430/321, 945
See application file for complete search history.

(56) References Cited

U.S. PATENT DOCUMENTS

| 2002/0170887 A1* | 11/2002 | Furuta ................ B23K 15/0006 |
| | | 219/121.19 |
| 2010/0118172 A1 | 5/2010 | McCarten et al. |
| 2013/0229486 A1 | 9/2013 | Molnar et al. |

OTHER PUBLICATIONS

Gill, Patrick et al., "Lensless Ultra-Miniature Imagers Using Odd-Symmetry Spiral Phase Gratings", article presented at Computational Optical Sensing and Imaging (COSI), Arlington, Virginia, Jun. 23-27, 2013. 3 pages.

Gill, Patrick et al., "Lensless Ultra-Miniature Imagers Using Odd-Symmetry Spiral Phase Gratings", slide deck presented at Computational Optical Sensing and Imaging (COSI), Arlington, Virginia, Jun. 23-27, 2013. 18 pages.

Guerineau, N. et al., "Generation of Achromatic and Propagation-Invariant Spot Arrays by Use of Continuous Self-Imaging Gratings", vol. 26, No. 7, Apr. 1, 2001. 3 pages.

Horisaki, Ryoichi et al., "Regularized Image Reconstruction for Continuously Self-Imaging Gratings", vol. 52, No. 16, Jun. 1, 2013. 10 pages.

Morrison, Rick L., "Symmetries that simplify the design of spot array phase gratings", Journal of the Optical Society of America A, vol. 9, Issue 3, pp. 464-471, 1992. 8 pages.

Piponnier, Martin et al., "Relevance of Continuously Self-Imaging Gratings for Noise Robust Imagery", vol. 37, No. 17, Sep. 1, 2012. 3 pages.

* cited by examiner

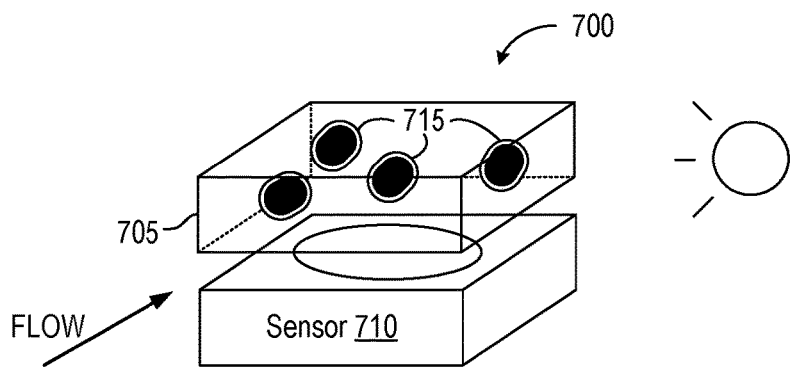
FIG. 7
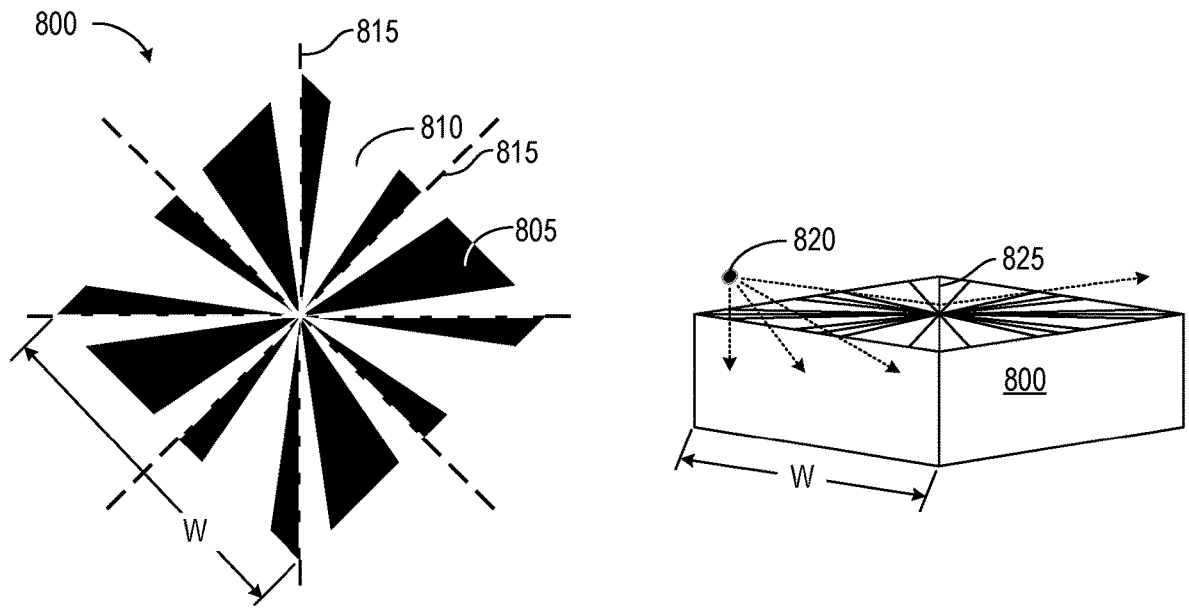
FIG. 8A
FIG. 8B
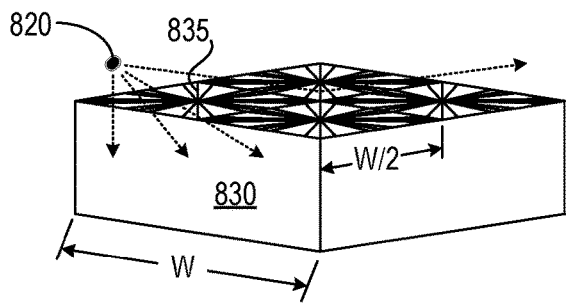
FIG. 8C

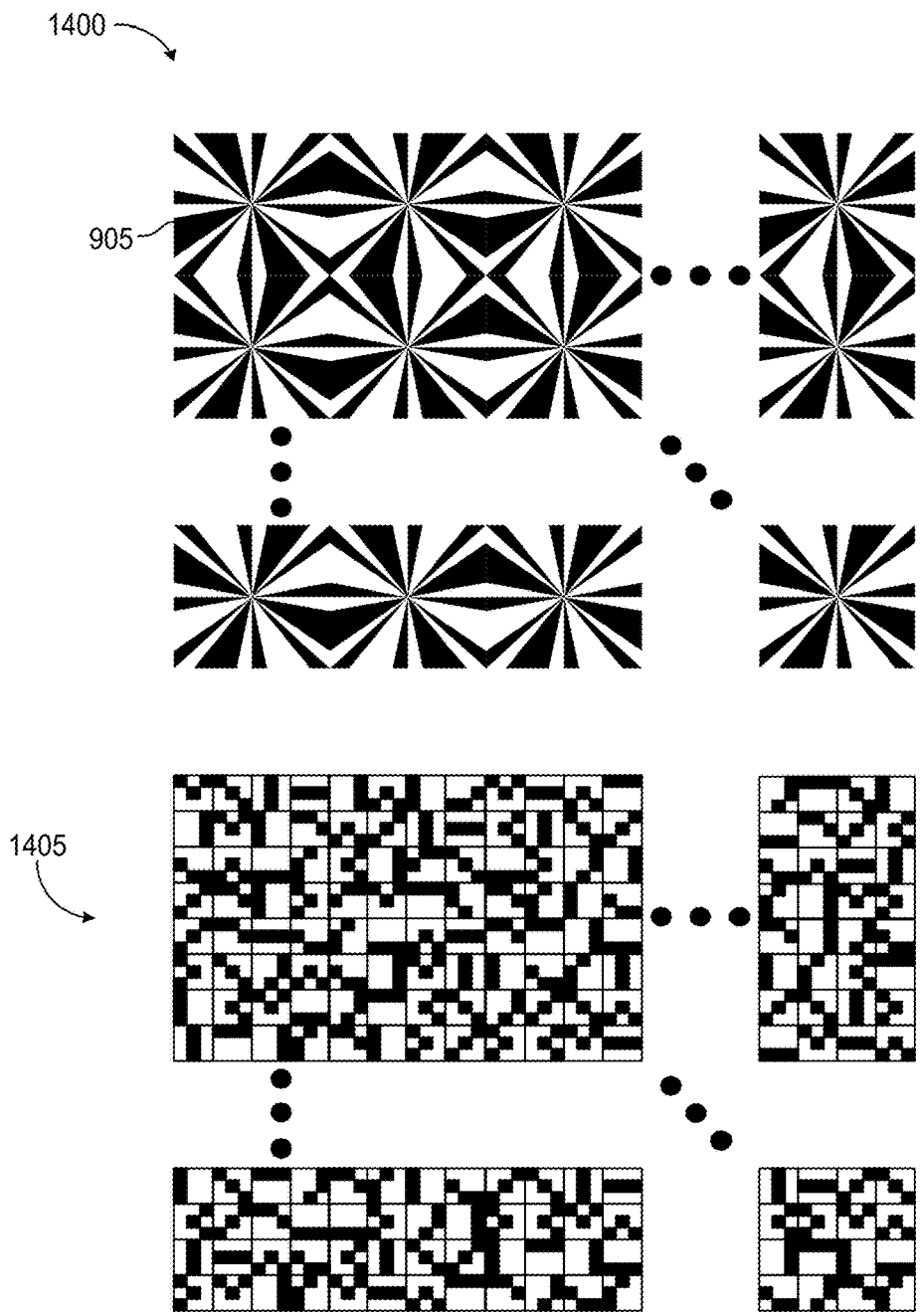
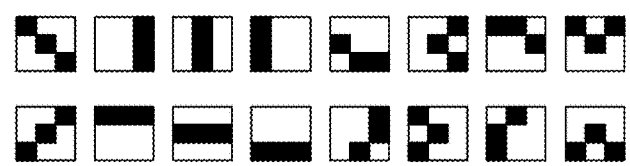
FIG. 14A
FIG. 14B

OPTICAL SENSING WITH TESSELLATED DIFFRACTION-PATTERN GENERATORS

BACKGROUND

A planar Fourier capture array (PFCA) is an image sensor that does not require a lens, mirror, or moving parts. As a consequence, cameras that employ PFCAs to acquire image data can be made extraordinarily small and inexpensive. PFCAs include angle-sensitive pixels whose sensitivity to light is a sinusoidal function of incident angle within the imager's field of view. The measurement from one photodiode from a PFCA can be interpreted as a measure of one component of the two-dimensional (2D) Fourier transform of a far-away scene. Each pixel has physical characteristics that make is sensitive to a distinct component of the 2D Fourier transform of the far-away scene. Taken together, these components relate full Fourier information representative of the scene. Some applications may use the Fourier components directly, or images of the scene can be computationally reconstructed.

PFCAs exploit a near-field diffraction effect named for Henry Fox Talbot (the "Talbot effect"). Briefly, a plane wave incident upon a periodic diffraction grating produces a repeating image of the grating at regular distances away from the grating plane. A second grating, or "analyzer," beneath the first grating passes or blocks the image depending on the incident angle. The resultant pattern is then captured by a conventional photodetector array. Finally, the subject of the image is resolved computationally from the captured pattern.

The spacing between the grating layers, and between the grating layers and the photodetector array, can be very difficult to manufacture with sufficient precision to ensure that the analyzer layer and the photodetector array fall precisely at the regular distances that accurately reproduce a Talbot image. In standard CMOS processes, for example, interlayer thicknesses can vary by 20%. Also problematic, Talbot spacing is a strong function of wavelength, making it exceedingly difficult to produce sharp Talbot images over some wavelength bands of interest (e.g., the visible light spectrum).

BRIEF DESCRIPTION OF THE DRAWINGS

The detailed description is illustrated by way of example, and not by way of limitation, in the figures of the accompanying drawings and in which like reference numerals refer to similar elements and in which:

FIG. 7 depicts a flow cytometer 700 in accordance with one embodiment, and is here used to illustrate the challenge of imaging in two dimensions for a very near scene.

FIG. 8A is a plan view of a sensor 800 in accordance with another embodiment.

FIG. 8B is a side view of sensor 800 of FIG. 8A with a blood cell 820 in close proximity to illustrate a problem with imaging nearby objects.

FIG. 8C is a side view of a sensor 830 of FIG. 8B in accordance with an embodiment that improves near-field imaging.

FIG. 14A depicts a sensor 1400 in accordance with another embodiment.

FIG. 14B depicts 16 per-pixel analyzer patterns used in FIG. 14A to create the pattern of analyzer 1405.

DETAILED DESCRIPTION

Figures 1A, 1B:
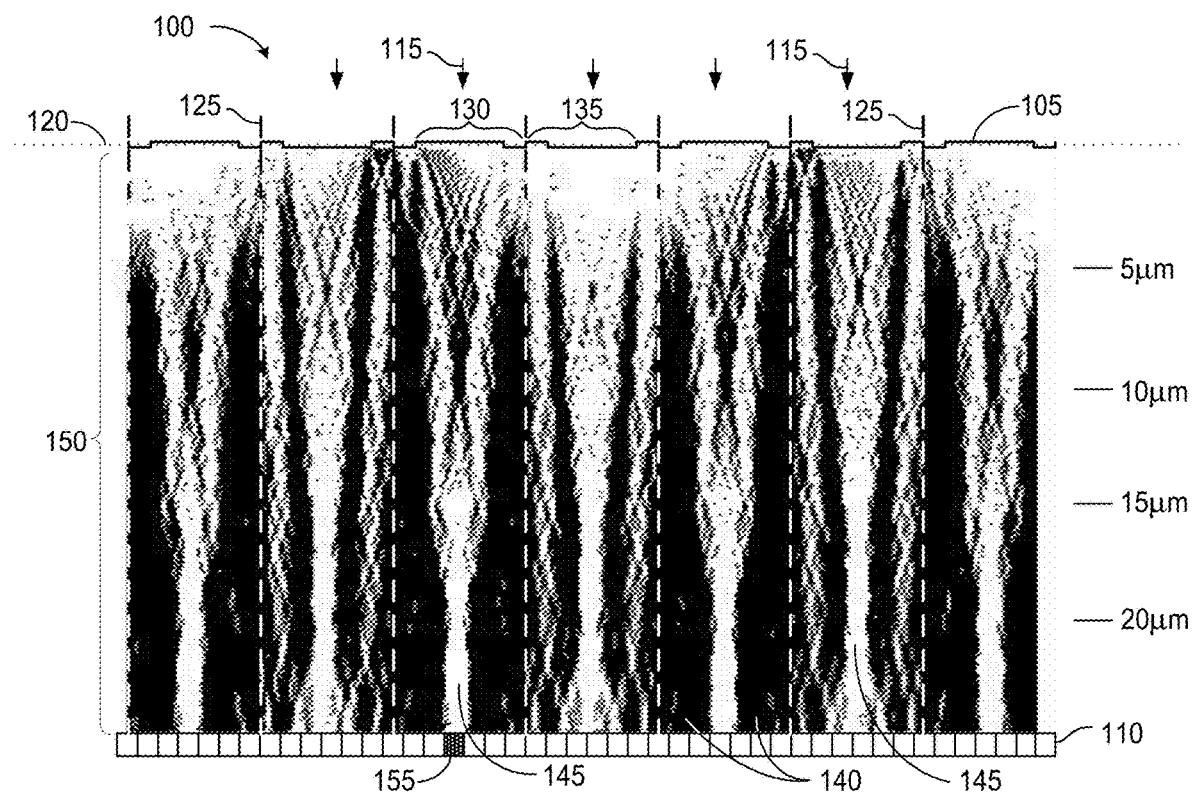
FIG. 1A is a cut-away view of an imaging device 100 with a phase anti-symmetric grating 105 overlying a photodetector array 110.
FIG. 1B depicts sensor 100 of FIG. 1A simulating light incident plane 120 at an acute angle 160 to illustrate the sensitivity of curtains 140 and foci 145 to the angle of incidence.

FIG. 1A is a cut-away view of an imaging device 100 with a phase anti-symmetric grating 105 overlying a photodetector array 110, such as a CCD (charge-coupled device), CMOS (complementary metal-oxide-semiconductor) or (in the case of midwave IR detection) a microbolometer sensor. The photodetector array may comprise a lenslet array designed to concentrate incident photons onto the most sensitive areas of the array to increase quantum efficiency. The features of grating 105 offer considerable insensitivity to the wavelength of incident light in a wavelength band of interest, and also to the manufactured distance between grating 105 and photodetector array 110. Grating 105 produces an interference pattern for capture by array 110. Digital photographs and other image information can then be extracted from the pattern.

Light in a wavelength band of interest is striking grating 105 from a direction 115 that is normal to a transverse plane 120 of the grating 105. Unless otherwise stated, the wavelength band of interest is the visible spectrum. Cameras developed for use in different applications can have different bands of interest, as is well understood by those of skill in the art.

Dashed lines 125 highlight periodic boundaries between regions of phase anti-symmetry. Each of these boundaries is a result of features 130 and 135 of odd symmetry, and produces a normally arranged curtain 140 of minimum intensity created by destructive phase interference between adjacent features 130 and 135. Curtains 140 are separated by foci 145 (curtains of maximum light intensity), and the collection of curtains 140 and foci 145 extend from grating 105 through the body 150 of device 100 to produce an interference pattern on photodetector array 110. In this illustration, the pattern of intensity variations evident in the foci and curtains are near-field spatial modulations that result from near-field diffraction. One photosensitive element 155 within array 110 is shaded beneath a focus 145 to serve as a reference for a subsequent discussion of the sensitivity of device 100 to the angle of incident light.

The image of FIG. 1A resulted from a simulation of an imaging device with the following parameters and assuming specific parameters. Body 150 is of fused silica, and is in contact with a conventional photodetector array 110 with photosensitive elements spaced by 2.2 µm. The top of grating 105 is an air interface in this example. The relatively small segments of features 130 and 135 are about 1 µm, and the relatively larger segments are about 4 µm. These segments generally form transverse plane 120, which is separated from array 110 by about 25 µm. Curtains 140 and foci 145 are the destructive and constructive interference patterns for 532 nm incident light.

The thickness of body 150 and lengths of the segments of features 130 and 135 were optimized for 400 nm light despite the selection of 532 nm light for the simulation. As a consequence, the tightest focus occurs about 5 um above array 110 (at the 20 µm mark). The resultant curtains 140 plainly separate foci 145 well above and below the 20 µm mark, however, illustrating a robust insensitivity to wavelength within the band of interest. The relatively deep and continuous penetration of curtains 140 also provides considerable manufacturing tolerance for the thickness of body 150. These advantages obtain because the near-field spatial modulations projected onto array 110 are wavelength independent over the wavelength band of interest, which means that the adjacent modulations (dark and light) do not reverse signs with changes in wavelength within the band of interest.

FIG. 1B depicts imaging device 100 of FIG. 1A simulating light incident plane 120 at an acute angle 160 to illustrate the sensitivity of curtains 140 and foci 145 to the angle of incidence. Using element 155 as a reference point, we see that that the foci 145 that illuminated element 155 in FIG. 1A have considerably moved to the right in FIG. 1B. Curtains 140 and foci 145 extend at an acute angle that relates to angle 160 according to Snell's law. The separation of foci 145 by curtains 140 is maintained. Imaging device 100 is thus sensitive to the angle of incidence.

Each phase anti-symmetric structure generates a diffraction pattern, and the resultant collection of patterns is itself a pattern. For a point source, this pattern of light intensity on the sensor is called a "point-spread function" (PSF). As used herein, a "diffraction-pattern generator" is a structure that produces PSFs for light within the wavelength band of interest, and for a range of orientations of interest. In this one-dimensional example, the orientation of interest is perpendicular to the boundaries of odd symmetry.

Figure 2:
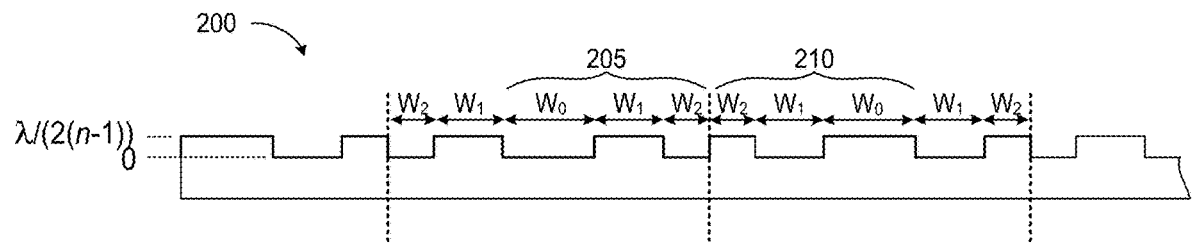
FIG. 2 depicts a one-dimensional, binary phase anti-symmetric grating 200 in accordance with one embodiment.

FIG. 2 depicts a one-dimensional, binary phase anti-symmetric grating 200 in accordance with one embodiment. The upper features of grating 200 are at a height $\lambda/(2(n-1))$, sufficient to induce one-half wavelength of retardation in the band of interest relative to lower features, or $\pi$ radians of relative phase delay. Features 205 and 210 on either side of each boundary exhibit odd symmetry with three differently sized segments $W_0$, $W_1$, and $W_2$. With this arrangement, paired segments (e.g., $W_0$ within features 205 and 210) induce respective phase delays that differ by approximately half a wavelength over the wavelength band of interest.

Figure 3A:
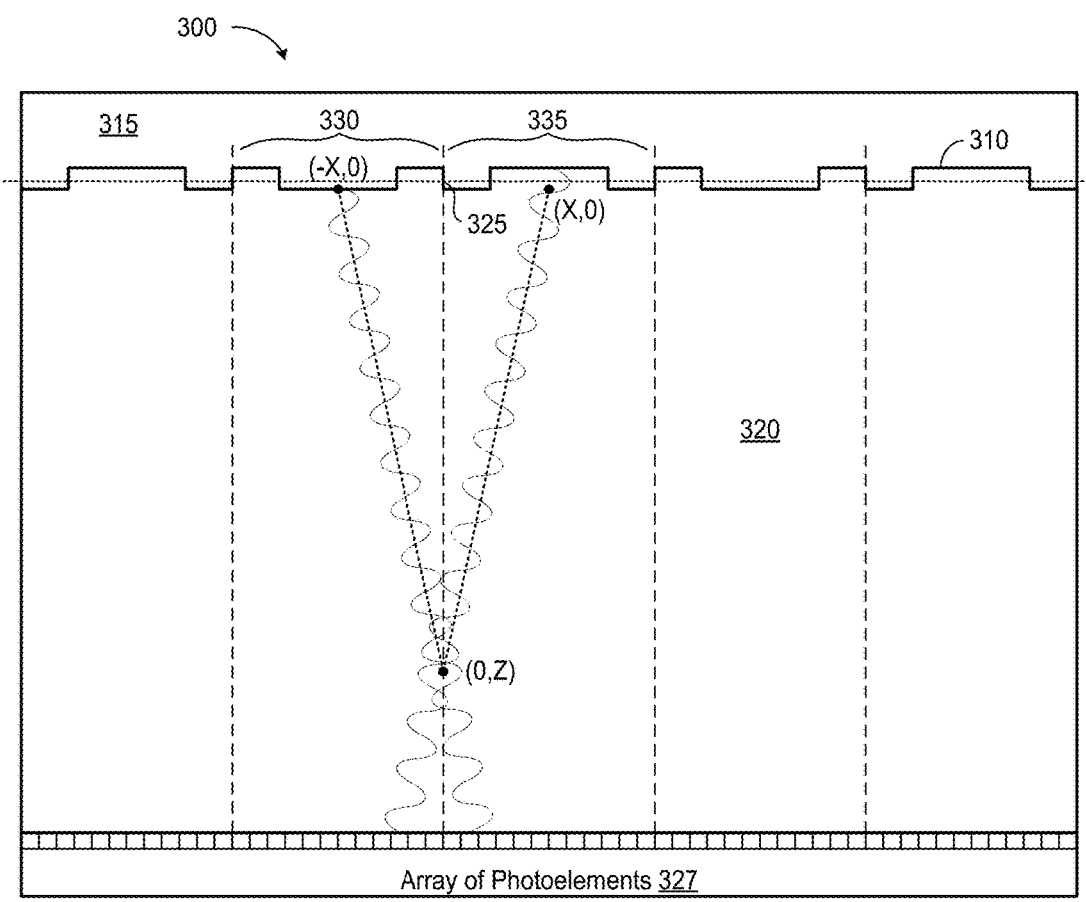
FIG. 3A depicts an imaging device 300 in accordance with an embodiment in which a binary, phase anti-symmetric grating 310 is formed by an interface between light-transmissive media of different refractive indices.

FIG. 3A depicts a imaging device 300 in accordance with an embodiment in which a binary, phase anti-symmetric grating 310 is formed by an interface between light-transmissive media of different refractive indices, a polycarbonate layer 315 and optical Lanthanum dense flint glass 320 in this example. Each of four boundaries of odd symmetry 325 is indicated using a vertical, dashed line. As in the foregoing examples, the upper features of grating 310 induce phase retardations of half of one wavelength ($\pi$ radians) relative to lower features. Features 330 and 335 on either side of each boundary exhibit odd symmetry. With this arrangement, paired features induce respective phase delays that differ by approximately half a wavelength over the wavelength band of interest.

Due to dispersion, the difference in the refractive index of polycarbonate layer 315 and Lanthanum dense flint glass layer 320 is an increasing function of wavelength, facilitating a wider wavelength band of interest over which the phase delay is approximately $\pi$ radians. These elements produce an interference pattern on an analyzer layer 327 (e.g., a conventional photodiode array) in the manner detailed in connection with FIGS. 1A and 1B.

This example assumes light incident the light interface of grating 310 is normal to the transverse plane of phase grating 310, in which case light fields that enter grating 310 equidistant from a one of the boundaries of odd symmetry 325, such as at locations (−X,0) and (X,0), are out of phase at points beneath array 310 (e.g., point (0,Z)), and thus destructively interfere to produce curtains of minimum intensity (e.g., curtains 140 of FIG. 1). Neither the depth Z nor the wavelength of light over a substantial spectrum significantly influences this destructive interference. Constructive interference similarly produces foci of maximum intensity (e.g., foci 145 of FIG. 1). Both the high and low features admit light, which provides relatively high quantum efficiency relative to gratings that selectively block light.

The following discussion details phase gratings in accordance with examples described in P. R. Gill and D. G. Stork, "Lensless Ultra-Miniature Imagers Using Odd-Symmetry Spiral Phase Gratings," in Imaging and Applied Optics, J. Christou and D. Miller, eds., OSA Technical Digest (online) (Optical Society of America, 2013). In that article, Gill and Stork describe a phase grating formed by a high-n, low-dispersion substrate and a low-n, high-dispersion coating that can introduce approximately λ-independent phase shifts in all normally incident visible light. Similar gratings are discussed above. If there exist certain points p on this interface that satisfy the following symmetry in their transmission t(•) and phase retardation φ(•), $$t(p+y)=t(p-y)\forall y \tag{1}$$

$$\phi(p-y)=\phi(p-y)+\pi+2n\pi \forall y, m \in \{0, \pm 1, \pm 2, \ldots\} \quad (2)$$

where y is a horizontal translation transverse to the grating direction, then the grating has phase anti-symmetry about points p, and light will interfere destructively below p, regardless of λ and depth z.

A linear phase anti-symmetric grating above a photosensor array could pass information from a single spatial orientation of features in the far field (transverse to the grating orientation). However, to capture information about arbitrarily oriented features of a complex scene, it is preferable to have a complete distribution of orientations in the diffractive optic. More generally, if the point-source responses (PSRs) are approximately spatially invariant, the transfer function of the imager approximates convolution with the PSR function. In such a case, the PSR should have significant power at all 2D spatial frequencies to make the inversion problem of image recovery well-conditioned.

In one example provided in Gill and Stork, gratings were numerically optimized to focus visible light onto a photodetector array 100 μm below. Optical simulations estimated the imaging performance of such a device from a 60×60 pixel array with 2.2 μm pitch 100 μm below the gratings with the sensor illuminated by a complex scene far (>>100 μm) from the sensor. The resultant photocurrent from the pixel array was unintelligible when digitized and viewed directly as a digital image; however, the scene was reconstructed to a higher resolution than possible using a much larger PFCA using Tikhonov regularization. Gill and Stork report that compressed sensing techniques could be applied to improve the reconstruction quality if the scene is known to have a compressible structure. Compressed sensing could be especially advantageous if small gaps in the Fourier transform of the PSR exist.

Figure 3B:
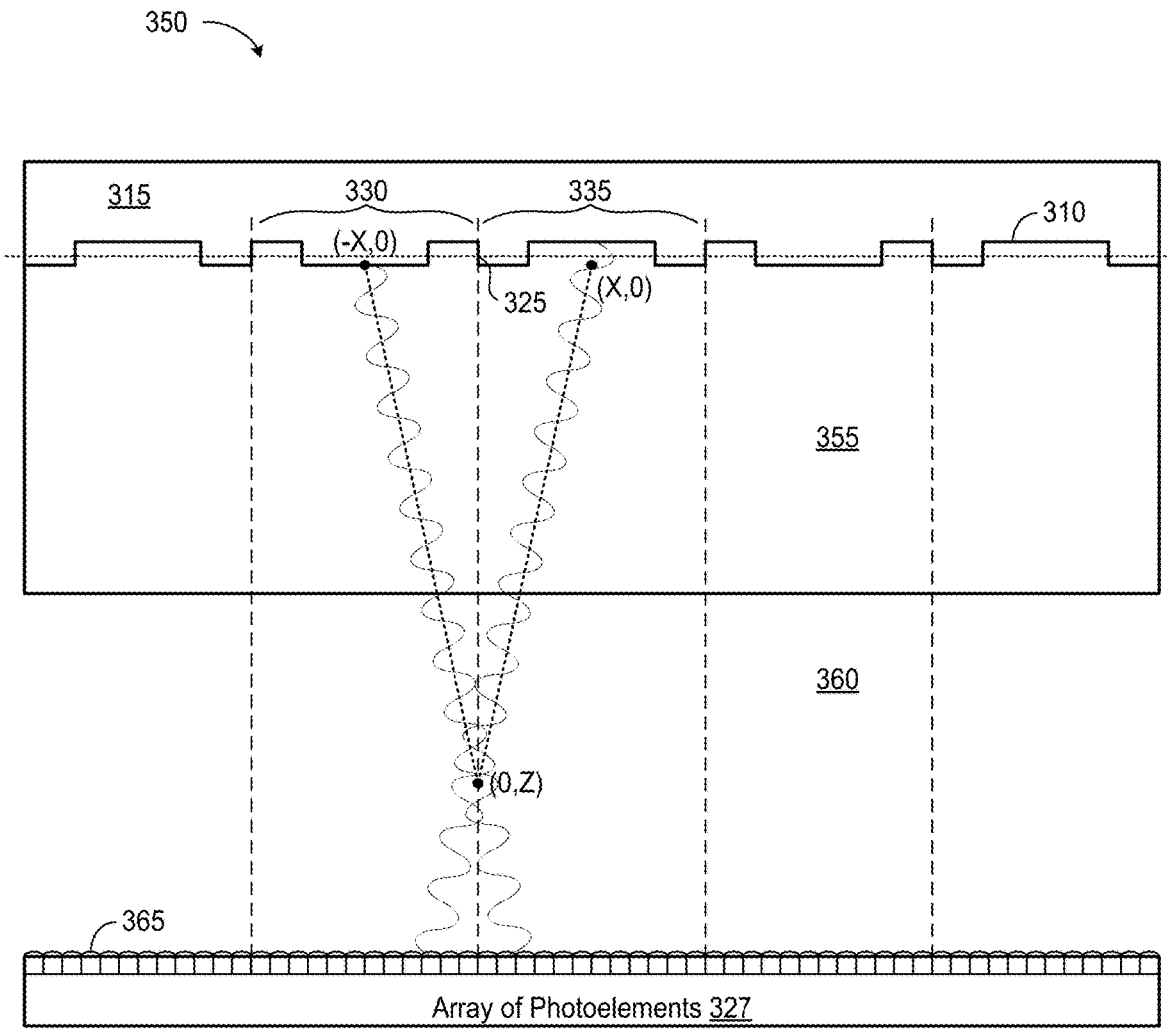
FIG. 3B depicts an imaging device 350 similar to device 300 of FIG. 3A, but equipped with an array of microlenses 365 disposed over the photoelements.

FIG. 3B depicts an imaging device 350 similar to device 300 of FIG. 3A, with like-identified elements being the same or similar. In this embodiment the light-transmissive media between grating 310 and analyzer layer 327 includes a flint glass layer 355 and an air interface 360. An array of microlenses 365 disposed over analyzer layer 327 focuses light onto the photoelements, each being coincident with a single photoelement in this example.

Near-Object Imaging

Phase anti-symmetric gratings of the type detailed herein support lensless cameras with considerably greater depths of field than more conventional imaging devices. Resolving very near objects still presents a challenge, however. Applications for near-field cameras include paper handling, flow cytometry, defect inspection, web inspection, and fingerprint scanning.

Figure 4:
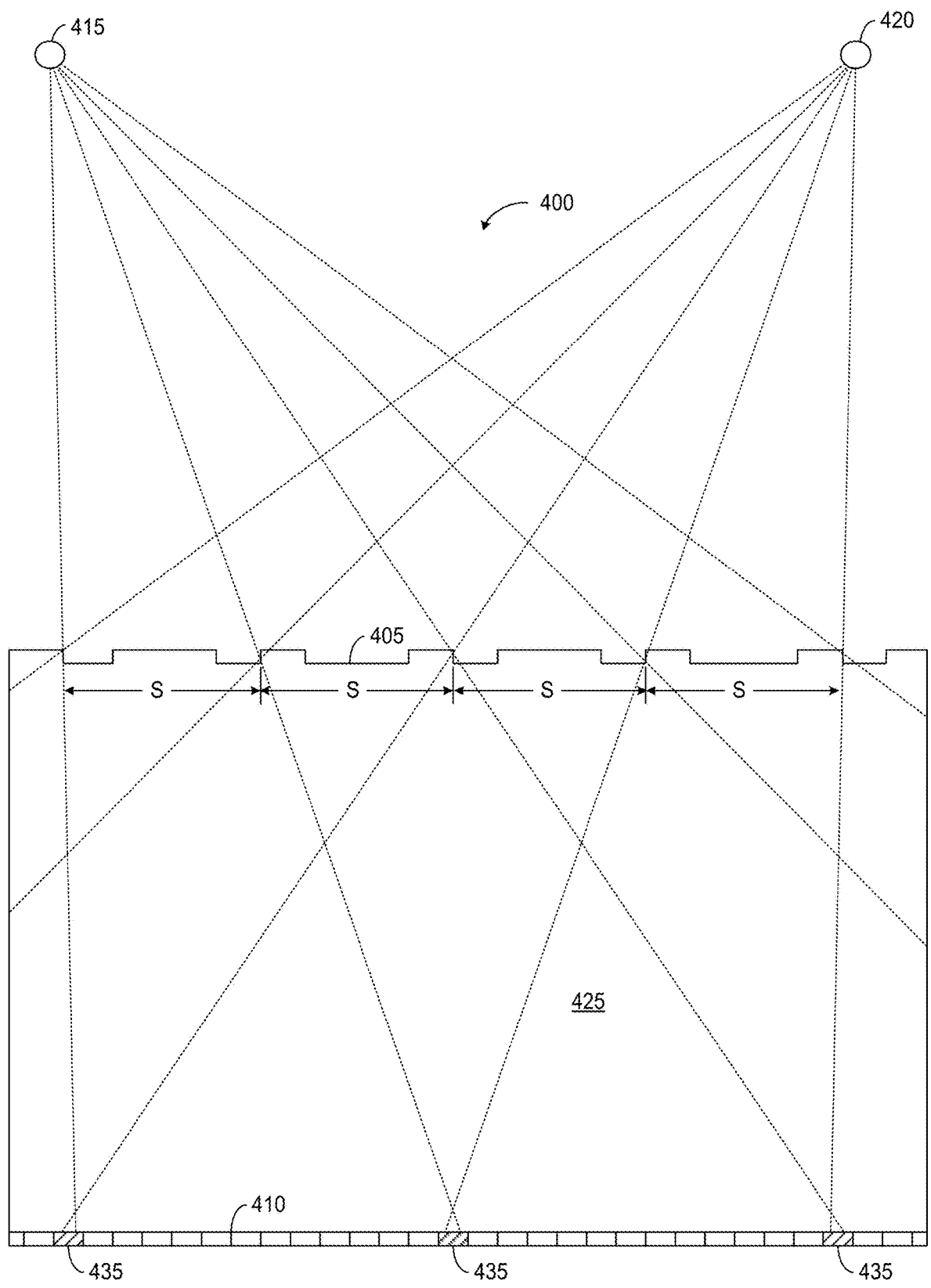
FIG. 4 is a cut-away view of an imaging device 400 with a phase anti-symmetric grating 405 overlying a photodetector array 410 and illuminated by a pair of nearby point sources 415 and 420.

FIG. 4 is a cut-away view of an imaging device 400 with a phase anti-symmetric grating 405 overlying a photodetector array 410 and illuminated by a pair of nearby point sources 415 and 420. Odd-symmetry boundaries are evenly spaced by a distance S. Dashed lines from sources 415 and 420 respectively represent diverging wavefronts for light incident grating 405. The portions of those lines within light-transmissive medium 425 can be said to represent the "curtains" of odd symmetry introduced previously. Sources 415 and 420 are very near to grating 405. As one measure of "near," sources are within a distance of $S^2/\lambda$, where S is the spacing introduced in FIG. 4. Imaging devices in accordance with some embodiments can image objects over a depth of field from $S^2/\lambda$ to infinity. Other near-object embodiments may not work optimally at infinity.

Due to the relative proximity of the imaged point sources 415 and 420, light incident array 410 enters medium 425 over a considerable range of angles. Light entering medium 425 via different diffraction-pattern generators can produce curtains that impinge upon the same photoelement, leading to some ambiguity. In this example, three curtains from point source 415 produce intensity minima at the same three photosensors 435 as do curtains from point source 420. The resultant ambiguity makes it difficult to distinguish between point sources 415 and 420.

Figure 5:
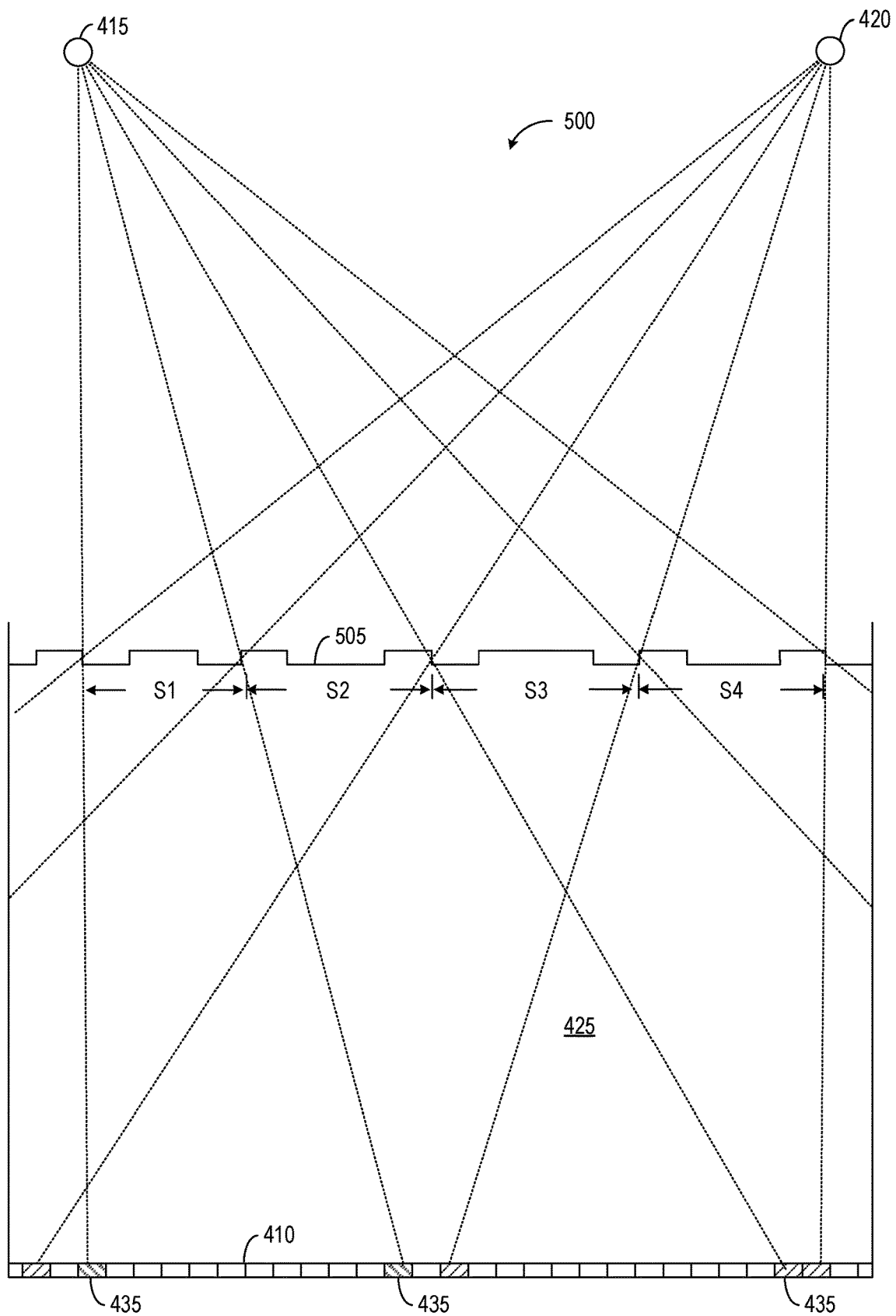
FIG. 5 is a cut-away view of an imaging device 500 with a phase anti-symmetric grating 505 with disparately spaced odd-symmetry boundaries.

FIG. 5 is a cut-away view of an imaging device 500 with a phase anti-symmetric grating 505 with disparately spaced odd-symmetry boundaries. But for the variety of spacings S1-S4, grating 505 is like the example of FIG. 4, with like-identified elements being the same or similar. The disparate spacings of the diffraction-pattern generators produce different patterns for the point sources that were ambiguous in the example of FIG. 4. Unequal generator spacing can introduce ambiguity for other point sources, but prevents spatially periodic replication of the same ambiguity over different regions of array 410.

Figure 6:
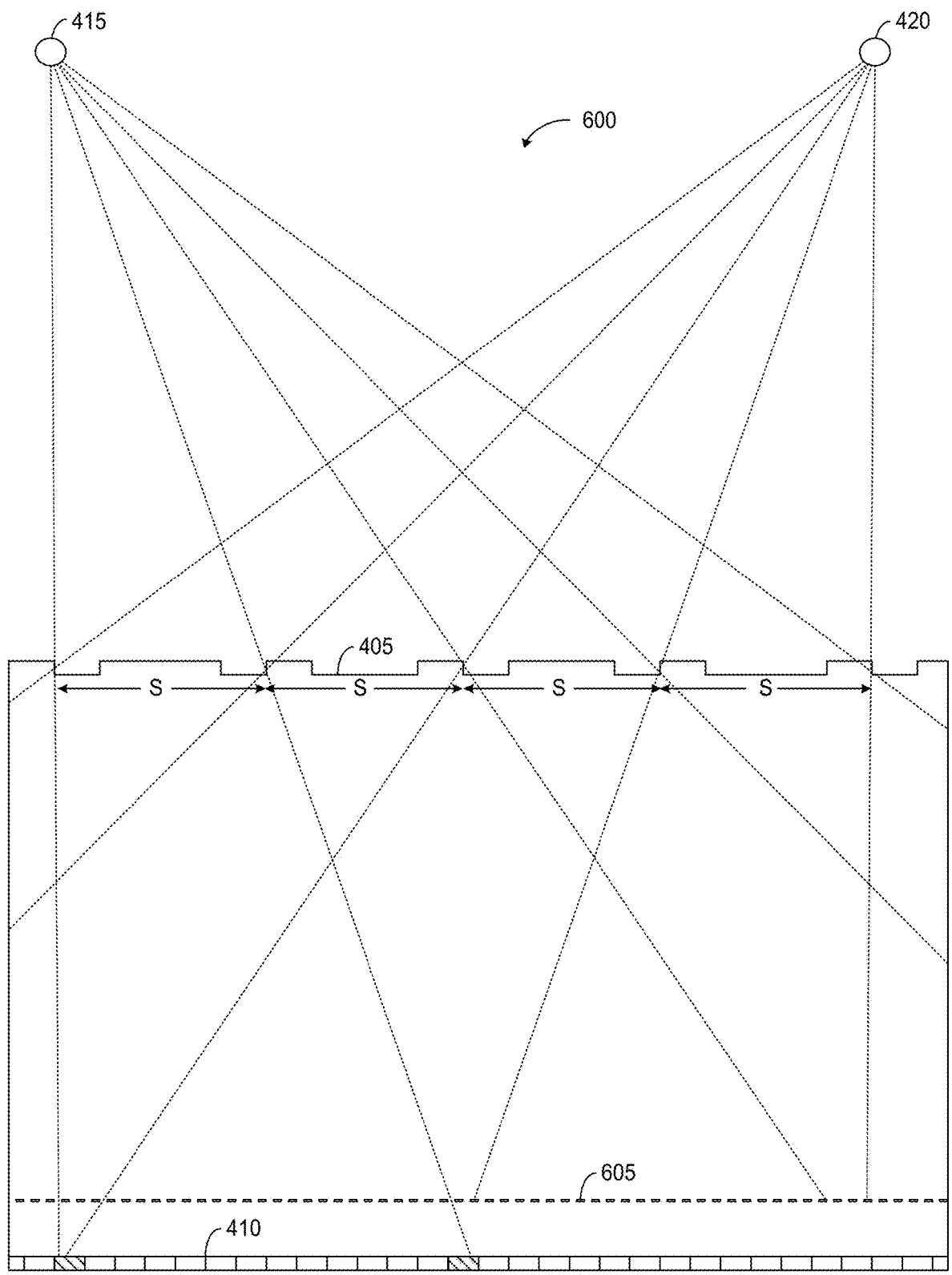
FIG. 6 is a cut-away view of an imaging device 600 in accordance with another embodiment.

FIG. 6 is a cut-away view of an imaging device 600 in accordance with another embodiment. As in the example of FIG. 4, device 600 includes an evenly spaced, phase anti-symmetric grating 405 overlying a photodetector array 410. Device 600 additionally includes an analyzer 605, which is in this example a grating that selectively blocks incoming light. Foci between adjacent curtains are selectively blocked by analyzer 605 to provide angle sensitivity that resolves ambiguity. Also beneficial, the inclusion of analyzer 605 can improve resolution. For example, if features produced by the generators are narrower than the pixel pitch of array 410, a suitably optimized analyzer could alias this information so that photocurrent from array 410 is sensitive to less-than-single pixel shifts in the interference pattern. Both the grating and the analyzer are regular in this example, but in other embodiments the grating, the analyzer, or both can have a variety of shapes and spacings.

FIG. 7 depicts a flow cytometer 700 in accordance with one embodiment, and is here used to illustrate the challenge of imaging in two dimensions for a very near scene. Flow cytometers are used for cell counting, cell sorting, biomarker detection and protein engineering. Particles of interest are suspended in a stream of fluid and passed by an electronic detection apparatus. In this example, cytometer 700 includes a channel 705, illuminated from the side, through which blood flows over a two-dimensional image sensor 710 in accordance with one embodiment. Light strikes the sides of blood cells 715 and is deflected down onto sensor 710 to appear (when properly focused) as bright spots against a relatively dark background. Data from sensor 710 can be analyzed to derive various types of information about physical and chemical attributes of blood cells 715 individually and collectively.

Cytometer 700 is ideally small and inexpensive, both characteristics calling for a close separation between channel 705 and sensor 710. This arrangement leads to the same problem introduced in connection with FIG. 4; namely, due to the relative proximity of the imaged cells, light enters sensor 710 over a considerable range of angles, which leads to some spatial ambiguity. This problem is exacerbated in two dimensional imaging systems by the need for orientation information.

FIG. 8A is a plan view of a sensor 800 in accordance with another embodiment. Relatively high segments 805 and low segments 810 on either side of each of eight boundaries of odd symmetry 815 create a grating in which the boundaries diverge from the center of sensor 800 such that the widths of the segments increase toward the periphery. For a given focal depth, light of higher frequencies tends to produce a sharper focus with narrower feature widths. Sensor 800 can therefore be optimized such that the central portion of the grating is optimized for collection of relatively higher frequency light, and the peripheral area for collection of relatively lower frequency light. Boundaries 815 are straight and continuous in this example, but may be curved, discontinuous, or both in other embodiments.

FIG. 8B is a side view of sensor 800 of FIG. 8A with a blood cell 820 in close proximity to illustrate a problem with imaging nearby objects. Wavefronts from objects or point sources relatively near sensor 800, from a perspective normal to the depicted surface, impinge upon the sensor surface over a relatively broad range of angles. If the angles are too extreme, light evincing some orientations cannot be imaged. In the depicted example, blood cell 820 is in close proximity to sensor 800 and over the leftmost corner. Light from the blood cell that impinges upon sensor 800 along boundary 825 is incident at too acute an angle to be properly resolved by sensor 800, or even to enter the surface. The captured PSF would therefore lack the full complement of orientation data for resolving blood cell 820.

FIG. 8C is a side view of a sensor 830 of FIG. 8B in accordance with an embodiment that improves near-field imaging. The generator pattern of sensor 800 is replicated four times over the same area as in the example of FIG. 8B (i.e., each generator has a width W/2). The smaller generators provide a full complement of orientation information over a smaller range of incident angles to that the captured PSF would provide more orientation data from which to resolve blood cell 820. To illustrate this point, one ray entering sensor 830 is shown to pass through a boundary 835 that provides the same orientation information as boundary 825 of FIG. 8B.

Figure 8D:
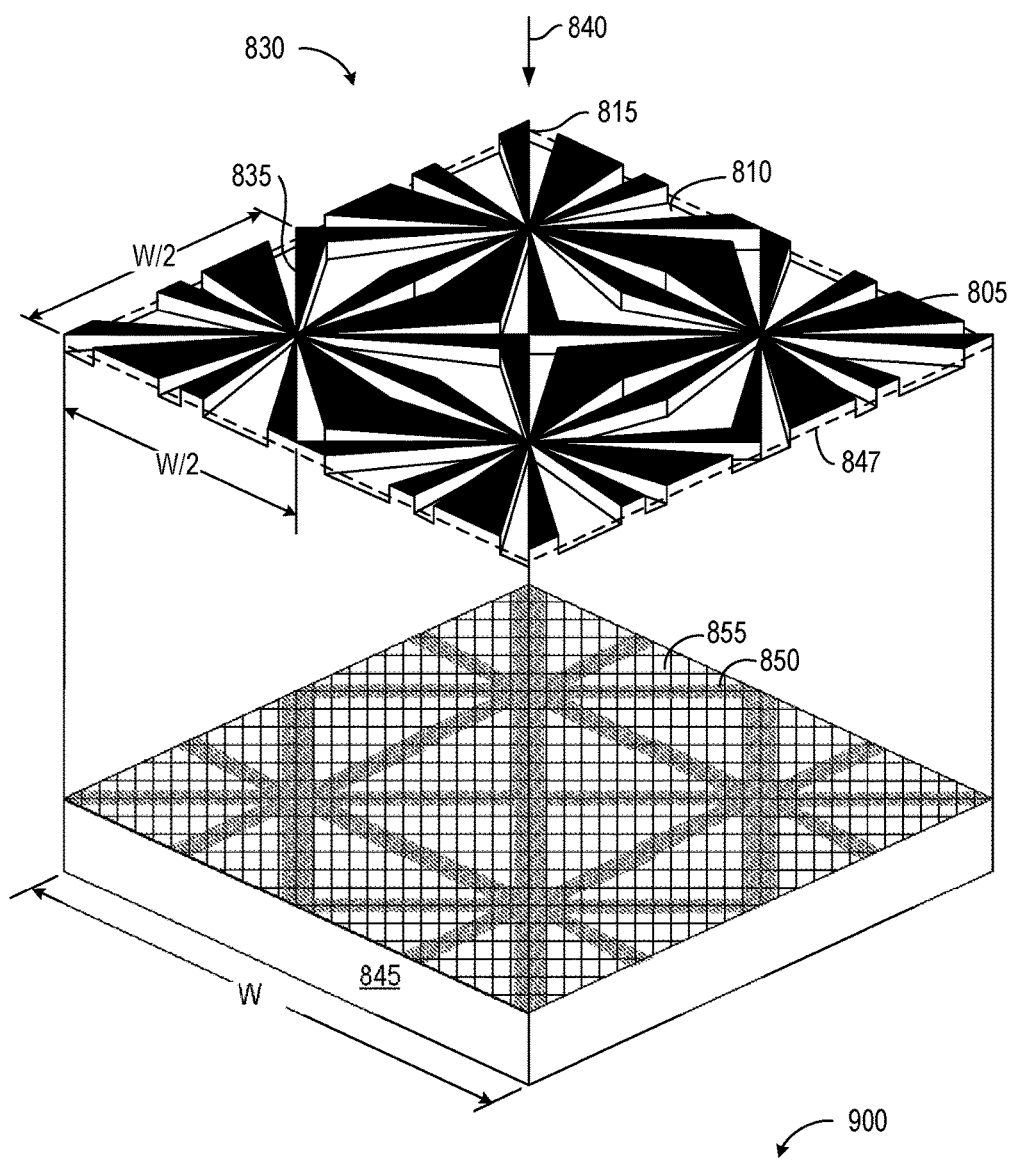
FIG. 8D is a three-dimensional perspective of a sensor 830 of FIG. 8C.

FIG. 8D is a three-dimensional perspective of a sensor 830 of FIG. 8C. Light 840 from a direction normal to the grating surface casts an interference pattern on an underlying photodiode array 845, with the four generator patterns extending in a transverse plane 847. Curtains and foci, as detailed previously, respectively cast shadows 850 and bright shapes 855 to be sensed by individual photosensitive elements of array 845. Array 845 captures a digital representation of the resulting pattern. Because the grating pattern instances have considerably less area than in the prior example, light from a given point impinges a full set of odd-symmetry features over a smaller range of incident angles.

Figure 9:
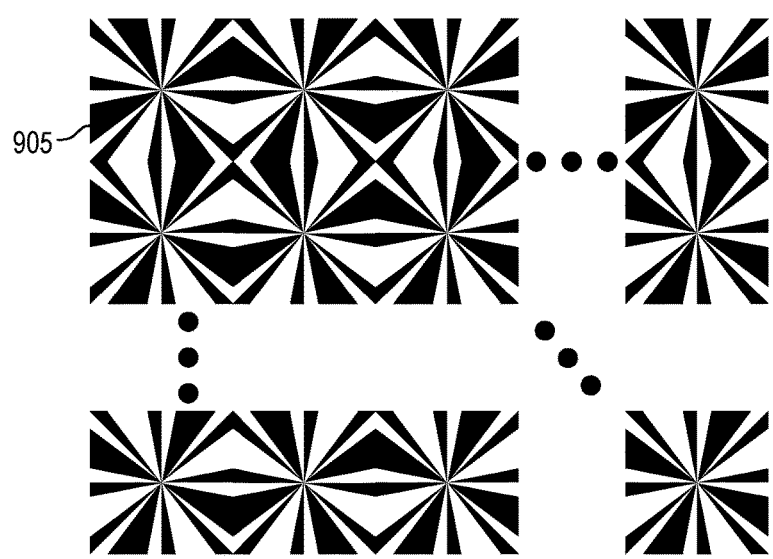
FIG. 9 is a plan view of a sensor 900 in accordance with an embodiment in which identical gratings 905 are arrayed e.g. for improved sensing of nearby objects.

FIG. 9 is a plan view of a sensor 900 in accordance with an embodiment in which identical grating pattern instances 905 are arrayed e.g. for improved sensing of nearby objects. Assume, for example, that light from a point source directly above the upper-left grating pattern instance 905 impinges upon the upper-right array at angles too acute to enter the upper-right array, and that that light from a point source directly above the upper-right grating pattern instance likewise cannot enter the upper-left array. Sensor 900 can nevertheless image both point sources because each grating pattern instance 905 images sufficient orientation information. A single larger grating pattern instance of the same area as sensor 900 would not sense the requisite orientation information for two such point sources.

Each of grating pattern instances 905 is identical, but any number of parameters can be varied within and among grating pattern instances 905. For example, different shapes and types of grating instances can be used to create and image different types of interference patterns that can be combined or used separately to obtain some desired result, for example avoiding the ambiguity introduced by devices with strict or small-pitched periodicity. The decision to consider all or a specific subset of information generated by one or more of the constituent grating instances can be done once, such as at time of manufacture to accommodate process variations, or can be done dynamically to highlight different aspects of a scene. Emphasizing aspects of different patterns can be used, for example, to highlight light of different polarizations, wavelengths, or angles of incidence.

Figure 10A:
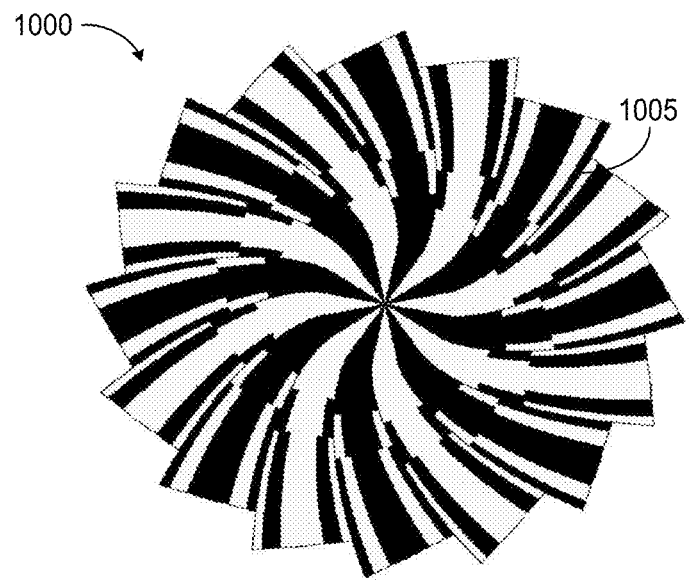
FIG. 10A is a plan view of a grating 1000 in accordance with another embodiment.
Figure 10B:
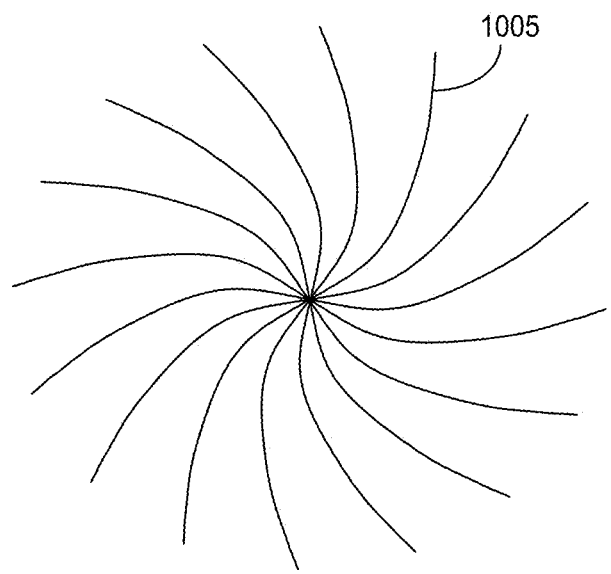
FIG. 10B depicts the shapes of boundaries 1005 of FIG. 10A.

FIG. 10A is a plan view of a grating 1000 in accordance with another embodiment. Recalling that relatively narrow (wide) segment spacing works better for relatively high (low) frequencies, feature spacing increases along odd-symmetry boundaries (between elevated and recessed grating regions, represented by dark and light) with distance from the center. Curved boundaries of odd symmetry 1005 extend radially from the center of the grating to the periphery, radiating out between the dark (elevated) and light (recessed) arms near the center. The curved boundaries are obscured by grating features in FIG. 10A, so the shapes of boundaries 1005 are depicted in FIG. 10B for ease of review. The segment widths do not continue to increase with radius, as there is a maximum desired width for a given wavelength band of interest (e.g., the widest may correspond to the lowest frequency of visible red light). The features that define boundaries 1005 therefore exhibit discontinuities as they extend toward the periphery of grating 1000. In this example, grating 1000 has three discrete areas each tuned to a subset or all of the wavelengths in the band of interest.

Grating 1000 does not tessellate efficiently, as is desirable for the reasons noted above in connection with FIG. 8A through FIG. 9. The inventors have therefore developed area-efficient gratings that offer orientation diversity for broad ranges of spatial frequencies.

Figure 11A:
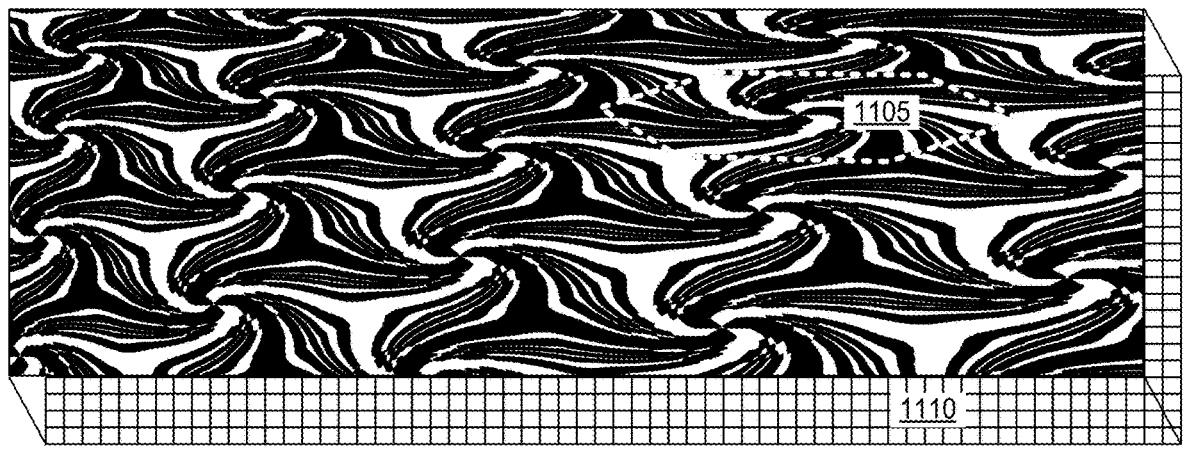
FIG. 11A depicts a sensor 1100 that includes tessellated diffraction-pattern generators 1105 overlying a regular array of photoelements 1110.

FIG. 11A depicts a sensor 1100 that includes tessellated diffraction-pattern generators 1105 overlying a regular array of photoelements 1110. Each generator 1105 occupies an area (the "generator area") considerably greater than the area occupied by one of the underlying photoelements 1110 (the "element area"). In this embodiment each photoelement is capable of resolving a location of photon arrival to within an element area less than one sixth of the generator area. The light-transmissive media separating generators 1105 from photoelements 1110 allows light to propagate horizontally as well as vertically, so light entering medium sensor 1100 at different angles and via different generators 1105 can produce curtains that impinge upon the same photoelement.

Sensor 1100 overcomes the angle limitations detailed above in connection with FIGS. 8B and 9 to effectively image nearby objects. Sensor 1100 differs from sensor 900, however, in that the constituent generators 1105 have spiral patterns that produce PSFs with most or all of the spatial frequencies and orientations of interest. Moreover, generators 1105 are not identical, but are shaped and placed with some irregularity to reduce or eliminate spatially periodic replication of ambiguities. As a consequence of this irregularity, adjacent generators 1105 exhibit slightly different PSFs for the spatial frequencies of interest and avoid the type of ambiguity seen by the device in FIG. 4. The ranges of spatial frequencies sensed by adjacent generators overlap considerably, and are essentially the same in some embodiments.

Figure 11B:
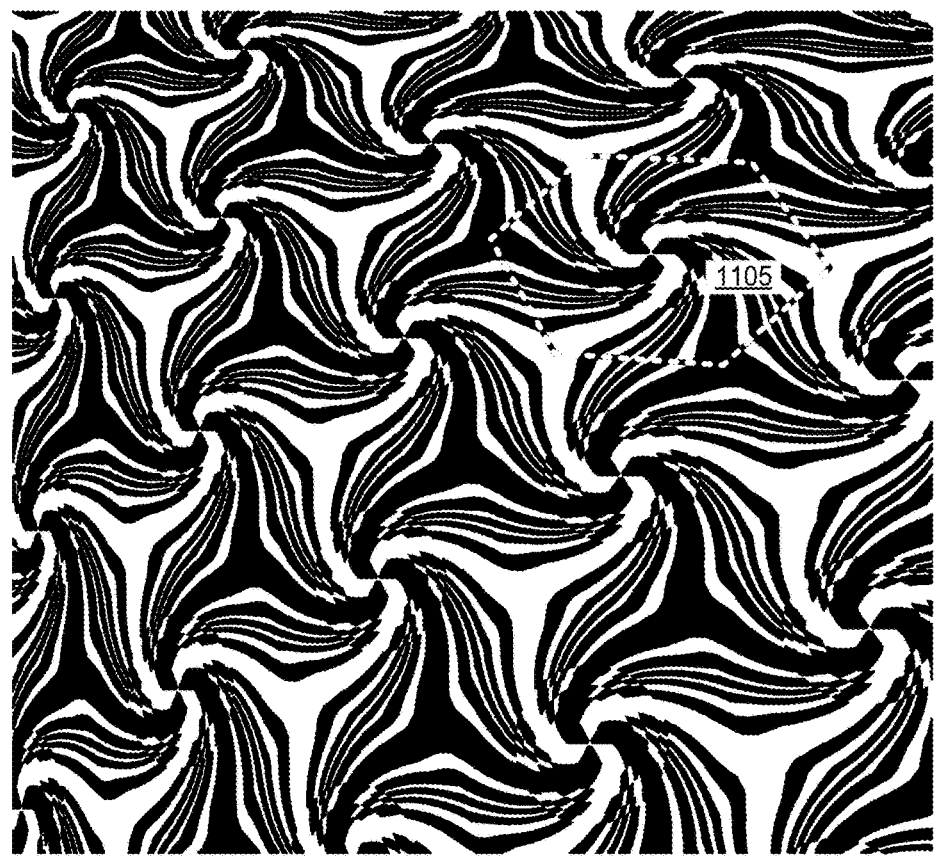
FIG. 11B is a plan view of sensor 1100 of FIG. 11A that more clearly shows the diversity of generators 1105.

FIG. 11B is a plan view of sensor 1100 of FIG. 11A that more clearly shows the diversity of generators 1105. Each generator 1105 is unique in this irregular mosaic, but other embodiments have similar short-range irregularity but exhibit a longer-range order. For example, gratings can be arranged in rows and columns, with varied but repeated spacing between rows, columns, or both. Rows and columns can be distorted, as by imposing sinusoidal or other forms of curvature onto the mosaic to produce a pattern of gratings that does not exhibit short-range repetition.

Figure 12:
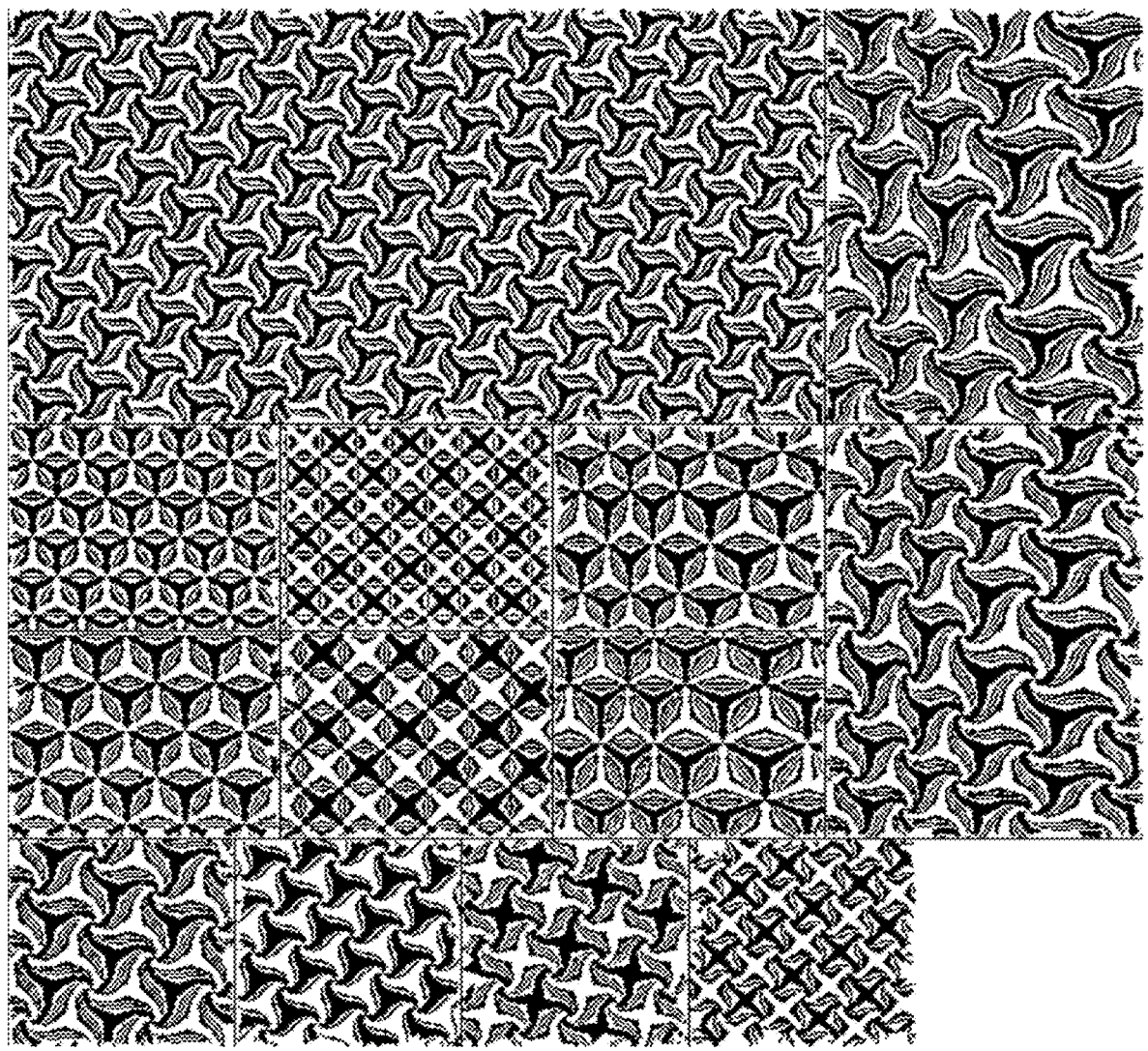
FIG. 12 depicts a number of alternative patterns of tessellated diffraction-pattern generators.

FIG. 12 depicts a number of alternative patterns of tessellated diffraction-pattern generators. In each example, neighboring generators give overlapping ranges of orientations and spatial frequencies, for wavelengths within the band of interest. In some examples the generators are arranged in regular mosaics (with evenly spaced rows and columns). In other examples the generators are varied in e.g. size, shape, and spacing to produce irregularity between neighboring generators and thereby reduce source location ambiguity.

Figure 13:
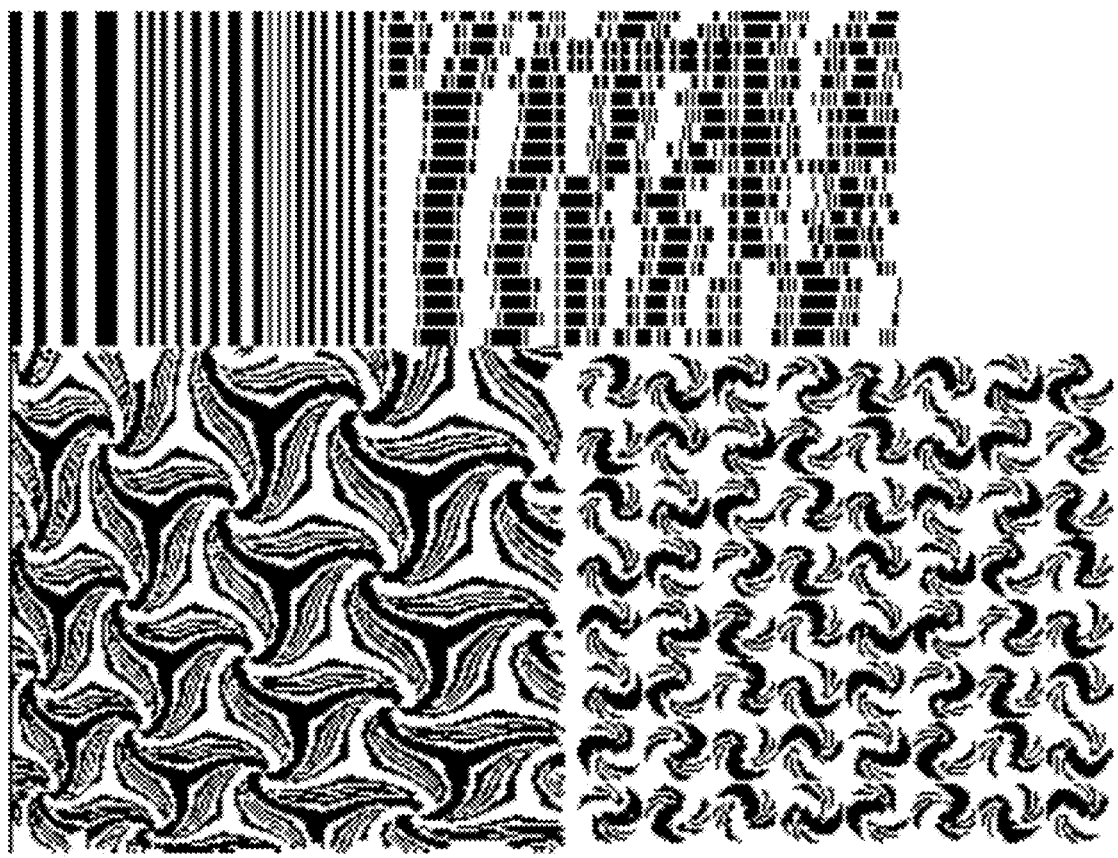
FIG. 13 depicts a number of alternative patterns of tessellated diffraction-pattern generators.

FIG. 13 depicts a number of alternative patterns of tessellated diffraction-pattern generators. At the upper left, a one-dimensional generator pattern provides diverse spacing for but one orientation. At the upper right is a test pattern. The pattern at the lower left illustrates generator diversity via spatial warping. Finally, the pattern at the lower right is a non-tessellated array of two-arm spirals that achieves orientation diversity using distinct rotation angles.

FIG. 14A depicts a sensor 1400 in accordance with another embodiment. Sensor 1400 is like sensor 900 of FIG. 9, with like-identified elements being the same or similar. Recalling the foregoing discussion of FIG. 6, an angle-sensitive analyzer can be used in lieu of, or in addition to, an irregular array of generators to resolve ambiguity and improve image resolution. Sensor 1400 includes an analyzer 1405, shown in plan view, between the generators and an underling sensor array (not shown). Adjacent generators are each sensitive to the same ranges of spatial frequencies and orientations in this embodiment, but randomized per-pixel patterns in the analyzer layer scramble the sampled interference pattern.

FIG. 14B depicts 16 per-pixel analyzer patterns used in FIG. 14A to create the pattern of analyzer 1405.

Figure 15A:
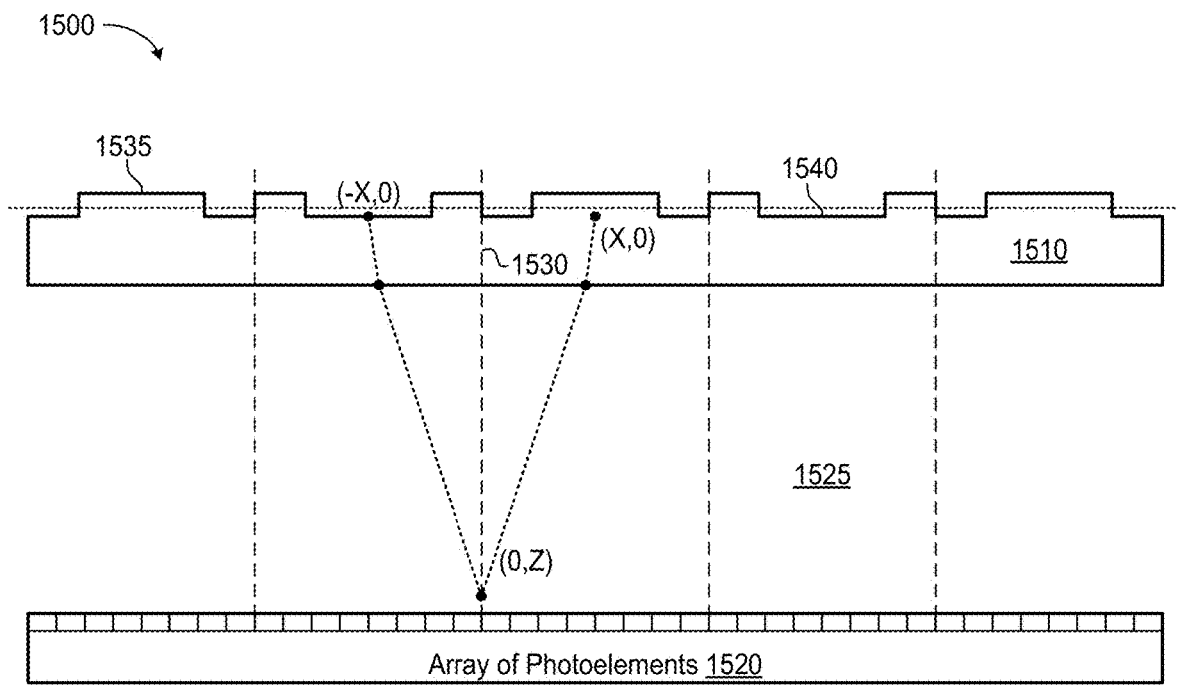
FIG. 15A depicts an infrared sensor 1500 in accordance with an embodiment in which a binary, phase anti-symmetric grating 1510 of a high-density polyethylene (HDPE) is separated from an array of photoelements 1520 by an air interface 1525.

FIG. 15A depicts an infrared sensor 1500 in accordance with an embodiment in which a binary, phase anti-symmetric grating 1510 of a high-density polyethylene (HDPE) is separated from an array of photoelements 1520 by an air interface 1525. Each of four boundaries of odd symmetry 1530 is indicated using a vertical, dashed line. These elements produce an interference pattern on array 1520 in the manner detailed in connection with FIGS. 1A and 1B. Any array of lenses may be included, in which case each lens may be coincident with a single photoelement.

This example assumes light incident the light interface of grating 1510 is normal to the transverse plane of phase grating 1510, in which case light fields that enter grating 1510 equidistant from a one of the boundaries of odd symmetry 1530, such as at locations (−X,0) and (X,0), are out of phase at points beneath array 1510 (e.g., point (0,Z)), and thus destructively interfere to produce curtains of minimum intensity (e.g., curtains 140 of FIG. 1).

Phase grating 1510 is much less than one millimeter thick, and thus admits most of the incident infrared (IR) light. The refractive index of HDPE for 10 μm IR radiation is approximately 1.54. Thick regions 1535 of grating 1510 are 10 μm taller than thin regions 1540, and thus introduce approximately a half-wavelength retardation compared to thin regions. In this example, grating 1510 is 50 μm thick at its thickest and 40 μm thick at its thinnest, and the separation between grating 1510 and the underlying IR sensor 1520 (for instance, a microbolometer) is 2 mm. The air gap between grating 1510 and array 1520 allows the grating to be thin, which advantageously limits IR absorption.

Figure 15B:
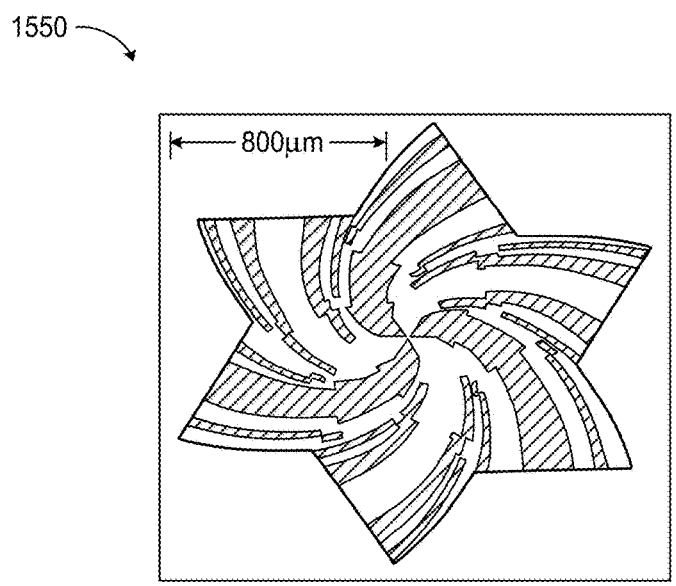
FIG. 15B is a plan view of grating 1510 in accordance with an embodiment for IR imaging as in FIG. 15A.

FIG. 15B is a plan view of grating 1510 in accordance with an embodiment for IR imaging as in FIG. 15A. Grating 1510 is similar to grating 1000 of FIGS. 10A and 10B, but with larger dimensions optimized for the longer wavelength of IR light as compared with the visible spectrum. As in the prior example, relatively narrow (wide) segment spacing works better for relatively high (low) frequencies, and feature spacing increases along odd-symmetry boundaries (between dark and light regions) with distance from the center. The microbolometer in this embodiment measures 2 mm by 2 mm, and the pattern on the film is a single 6-arm spiral 1550. The pixel pitch of array 1520 is 33.3 μm.

Figure 16:
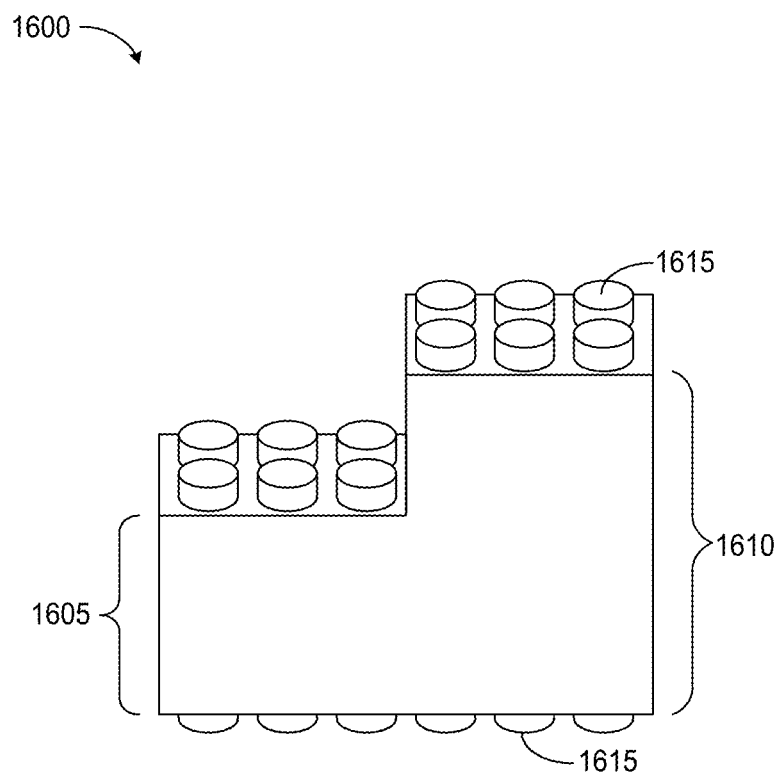
FIG. 16 shows a portion of a grating 1600, showing relatively thin and thick areas 1605 and 1610, in accordance with another embodiment.

FIG. 16 shows a portion of a grating 1600, showing relatively thin and thick areas 1605 and 1610, in accordance with another embodiment. Grating 1600 is e.g. molded HDPE, and includes arrays of micro-pillars 1615 on the top and bottom surfaces. In one embodiment of a sensor that employs such a grating, each micro-pillar 1615 is 2 μm tall and 3 μm wide, and the collection of pillars covers 45% of the surfaces. The pillar dimensions are smaller than the wavelength of IR light, so they collectively act like a material with an intermediate refractive index. The collections of micro-pillars 1615 act as quarter-wavelength anti-reflective coatings to the n=1.54 plastic HDPE film. A microbolometer used in this sensor can have a 33.3 micron-pitch, 240×240 pixels, making it 8 mm by 8 mm. Grating 1600 is 12 mm by 12 mm, centered over the microbolometer, and is separated from the microbolometer by 4 mm. Grating 1600 has e.g. a tessellated pattern of 6-arm spirals. For the IR sensor in accordance with the device described in FIG. 16, individual grating features may be 41% larger than for the device of FIG. 15 (twice the height, so the gratings are the square of root 2 times as wide), and approximately 18 whole spirals fit into the 12×12 mm area. The phase gratings can be arrayed, tessellated, and distorted as detailed previously for other sensors.

While the subject matter has been described in connection with specific embodiments, other embodiments are also envisioned. For example; while each grating detailed previously may be used in connection with photoreceptors to collect incident light, gratings in accordance with these and other embodiments can be used more generally in imaging devices that project images using photoelements that admit light; cameras described as using lenses could also employ other types of optical elements (e.g., mirrors); the wavelength band of interest can be broader or narrower than the visible spectrum, may be wholly or partially outside the visible spectrum, and may be discontinuous; and cameras and gratings detailed herein can be adapted for use in multi-aperture or programmable-aperture applications. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:
1. A light-transmissive grating comprising:
   adjacent diffraction-pattern generators extending in a transverse plane, each diffraction-pattern generator occupying a respective generator area, from a perspective normal to the transverse plane, and including:
   a periphery of the generator area in the transverse plane; and boundaries of odd symmetry that separate a plurality of high and low segments of the diffraction-pattern generator, the high and low segments having segment widths in the transverse plane, wherein the widths of the high and low segments increase toward the periphery.

2. The light-transmissive grating of claim 1, wherein the generator areas vary between ones of the diffraction-pattern generators.

3. The light-transmissive grating of claim 1, wherein the boundaries of odd symmetry from the adjacent diffraction-pattern generators meet at the peripheries of the adjacent diffraction-pattern generators.

4. The light-transmissive grating of claim 1, wherein the boundaries of odd symmetry radiate from a center of the respective diffraction-pattern generator.

5. The light-transmissive grating of claim 1, wherein the boundaries of odd symmetry are curved.

6. The light-transmissive grating of claim 1, wherein the boundaries of odd symmetry are discontinuous.

7. The light-transmissive grating of claim 1, wherein the boundaries of odd symmetry produce curtains of minimum intensity responsive to incident light normal to the light-transmissive grating.

8. The light-transmissive grating of claim 1, wherein the boundaries of odd symmetry separate light-transmissive features that induce relative phase shifts on light incident the light-transmissive grating.

9. The light-transmissive grating of claim 8, wherein the adjacent diffraction-pattern generators are immediately adjacent.

10. The light-transmissive grating of claim 1, wherein the diffraction-pattern generators are organized in a linear array.

11. A light-transmissive grating comprising:
tessellated and dissimilar adjacent diffraction-pattern generators extending in a transverse plane, each diffraction-pattern generator occupying a respective generator area, from a perspective normal to the transverse plane, and including:
a periphery of the generator area in the transverse plane; and
boundaries of odd symmetry that separate a plurality of high and low segments having segment widths in the transverse plane, wherein the widths of the high and low segments increase toward the periphery.

12. The light-transmissive grating of claim 11, wherein the generator areas vary between ones of the diffraction-pattern generators.

13. The light-transmissive grating of claim 11, wherein the boundaries of odd symmetry from the adjacent diffraction-pattern generators meet at the peripheries of adjacent ones of the diffraction-pattern generators.

14. The light-transmissive grating of claim 11, wherein the boundaries of odd symmetry radiate from a center of the respective diffraction-pattern generator.

15. The light-transmissive grating of claim 11, wherein the boundaries of odd symmetry are curved.

16. The light-transmissive grating of claim 11, wherein the boundaries of odd symmetry are discontinuous.

17. The light-transmissive grating of claim 11, wherein the boundaries of odd symmetry produce curtains of minimum intensity responsive to incident light normal to the light-transmissive grating.

18. The light-transmissive grating of claim 11, wherein the boundaries of odd symmetry separate light-transmissive features that induce relative phase shifts on light incident the light-transmissive grating.

19. The light-transmissive grating of claim 18, wherein the adjacent diffraction-pattern generators are immediately adjacent.

20. A light-transmissive grating comprising:
adjacent means for generating diffraction patterns, each means for generating a diffraction pattern extending in a transverse plane and occupying a respective generator area, from a perspective normal to the transverse plane, and including:
a periphery of the generator area in the transverse plane; and
boundaries of odd symmetry that separate a plurality of high and low segments having segment widths in the transverse plane, wherein the widths of the high and low segments increase toward the periphery.

* * * * *